(12) United States Patent
Esry et al.

(10) Patent No.: US 6,406,999 B1
(45) Date of Patent: Jun. 18, 2002

(54) SEMICONDUCTOR DEVICE HAVING REDUCED LINE WIDTH VARIATIONS BETWEEN TIGHTLY SPACED AND ISOLATED FEATURES

(75) Inventors: Thomas Craig Esry; Nace Layadi; Sylvia Marci Luque; Simon John Molloy, all of Orlando; Mario Pita, Winter Springs, all of FL (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/397,459

(22) Filed: Sep. 16, 1999

(51) Int. Cl.[7] .............................................. H01L 21/44
(52) U.S. Cl. ...................................... 438/669; 438/700
(58) Field of Search ................................ 438/700, 706, 438/708, 709, 710, 712, 719, 717, 618, 623, 637, 669; 216/80, 67, 68, 70, 79

(56) References Cited

U.S. PATENT DOCUMENTS

| | | | | |
|---|---|---|---|---|
| 4,717,445 A | * | 1/1988 | Leung .......................... 156/626 |
| 5,545,588 A | * | 8/1996 | Yoo ............................. 438/586 |
| 5,550,405 A | * | 8/1996 | Cheung et al. ............. 257/642 |
| 5,679,608 A | * | 10/1997 | Cheung et al. ............. 438/622 |
| 5,741,741 A | * | 4/1998 | Tseng .......................... 438/637 |
| 5,821,169 A | * | 10/1998 | Nguyen et al. ............. 438/736 |
| 5,918,126 A | * | 6/1999 | Fulford, Jr. et al. ........ 438/275 |
| 5,933,759 A | * | 8/1999 | Nguyen et al. ............. 438/700 |
| 5,945,350 A | * | 8/1999 | Violette et al. ............. 438/706 |
| 5,962,346 A | * | 10/1999 | Shue et al. .................. 438/720 |
| 5,965,934 A | * | 10/1999 | Cheung et al. ............. 257/642 |
| 5,968,711 A | * | 10/1999 | Lee et al. .................... 430/313 |
| 6,007,733 A | * | 12/1999 | Jang et al. ..................... 216/80 |
| 6,020,255 A | * | 2/2000 | Tsai et al. ................... 438/618 |
| 6,020,269 A | * | 2/2000 | Wang et al. ................. 438/717 |
| 6,027,995 A | * | 2/2000 | Chiang et al. ............. 438/623 |
| 6,066,548 A | * | 5/2000 | Ma et al. .................... 438/576 |
| 6,103,632 A | * | 8/2000 | Kumar et al. ............... 438/117 |

FOREIGN PATENT DOCUMENTS

EP          0 905 768     *  3/1999    ......... H01L/21/768

* cited by examiner

*Primary Examiner*—Olik Chaudhuri
*Assistant Examiner*—Ginette Peralta
(74) *Attorney, Agent, or Firm*—Christie, Parker & Hale, LLP

(57) ABSTRACT

A patterned film structure within a semiconductor device includes a pattern formed within a hardmask film, and a pattern formed within an underlying semiconductor or metal film beneath the hardmask film. The etch bias of both isolated and nested features formed within the patterned structure, is substantially the same with respect to a masking film formed over the hardmask film.

18 Claims, 3 Drawing Sheets

SEMICONDUCTOR DEVICE HAVING REDUCED LINE WIDTH VARIATIONS BETWEEN TIGHTLY SPACED AND ISOLATED FEATURES

RELATED APPLICATION

This application is related to U.S. Application Ser. No. 09/397,458, filed on Sep. 16, 1999.

FIELD OF THE INVENTION

This invention relates to semiconductor integrated circuit devices, most generally, and the processes for forming these devices. More specifically, this invention relates to the materials, processes, and structures used to provide a patterned gate electrode film including both isolated and tightly packed features having the same dimensions.

BACKGROUND OF THE INVENTION

At critical levels in integrated circuit device manufacturing, the control of critical feature dimensions and the etching processes which determine critical feature dimensions, become increasingly important as device features continue to shrink in size. An example of a critical feature dimension is line width. Line width control is especially important in the formation of gate electrodes of transistors formed within a semiconductor substrate. Gate electrode structures are formed by first forming a semiconductor film on a semiconductor substrate, then patterning the semiconductor film. By "patterning", it is meant that a film is formed, then portions of the film are removed by etching or other methods. The portions of the original film which remain, constitute the "patterned" film.

As gate electrode dimensions continue to shrink, it has become increasingly more important to accurately and repeatably pattern the gate electrode film to produce features having desired and predictable dimensions. It has also become more important to develop the ability to pattern the film in such a manner as to produce both isolated and tightly-packed features having the same dimensions. As such, the use of a "hardmask" has been widely adopted for forming a pattern within the gate electrode film.

A hardmask is a dielectric film such as a silicon nitride film, an oxide film, or a silicon oxynitride film which is formed over the gate electrode film prior to patterning the gate electrode film. An anti-reflective coating may additionally be formed over the dielectric film to aid in patterning. The anti-reflective coating may be a spun-on polymeric film such as an organic film, or it may be an anti-reflective film formed by other means such as by chemical vapor deposition. A pattern is first formed within a masking material such as photoresist, over the hardmask material. The hardmask is then etched, transferring the pattern from the masking material to the hardmask material. After the masking material has been removed, the hardmask material serves as a masking medium and the pattern formed in the hardmask film is then transferred to the gate electrode film, typically by means of etching. It has been found that the dimensions of the hardmask pattern are transferred quite accurately to the corresponding features of the gate electrode film during the gate electrode etching process which uses the hardmask pattern as a mask. It has also been found that the hardmask etch, which transfers the pattern of the photoresist masking material to the hardmask, is the largest contributor to variation in the final dimensions of the features formed within the gate electrode film, such as the gate length of a gate electrode serving as part of a transistor formed within the semiconductor substrate. As such, there is a demonstrated need to predictably, accurately, and repeatedly form features within a hardmask film having a desired dimension, from a pattern formed within a masking film produced according to the available technology.

In conventional hardmask etch processes, fluorinated gasses such as mixtures of $CHF_3$ and $CF_4$ have been used to etch the dielectric films which constitute the hardmask layer. Etch processes using these $CHF_3/CF_4$ mixtures are effective in transferring the features formed in photoresist masking film patterns, to the hardmask film, for technologies where the features formed in the photoresist masking pattern, such as line width, have dimensions of 0.35 microns and greater.

As device sizes continue to shrink, it has become desirable to produce both isolated and tightly-packed features within the gate electrode film having dimensions less than 0.35 microns. In order to produce a patterned gate electrode film including both isolated and tightly-packed features having the same dimensions, it is also desirable to simultaneously produce both isolated and tightly-packed features within the hardmask film having the same dimensions, during a single etching process. Tightly-packed, or nested features will hereinafter simply be referred to as nested features.

Etch bias is the difference in the dimensions of an etched feature compared to the dimensions of a corresponding feature within the masking pattern, from which the etched feature is formed. As smaller and smaller features are being produced, localized etching effects have a greater influence upon the feature produced by etching. It becomes more difficult, at smaller dimensions, to maintain the same etch bias for isolated features and tightly packed or nested features formed during the same etching process. This is due to polymers which form on the sidewalls of the features being etched, during, and as a result of, the conventional etch processes used. An isolated feature accumulates more polymer buildup than one which is nested, or close to another feature—i.e., tightly-packed. The result of this phenomenon is that an isolated feature will have a larger final size than a nested feature formed simultaneously during the same etch process, even if the corresponding features of the photoresist masking film from which they are formed, are of the same dimension. At design rules of 0.35 microns or smaller, the difference in etch bias and therefore the difference in etched dimensions, between nested and isolated features, becomes unacceptably significant.

The etched features of the patterned gate electrode film include gate electrodes for transistors formed within the semiconductor substrate. The line width of a line formed within a patterned gate electrode film is the primary influence upon the effective gate length $L_{eff}$ of such a transistor and is dependant upon the line width of the corresponding line formed in the hardmask film which, in turn, is dependant upon the line width of the corresponding line formed in the masking film. Transistors having different gate lengths ($L_{eff}$) have different electrical properties. When transistors which are intended to have similar electrical properties, are formed having different electrical properties, device performance is degraded and overall yield is therefore decreased. The $L_{eff}$ of transistors formed within a semiconductor device must lie within a tight range for the devices to perform according to the desired set of operational characteristics. This becomes increasingly more important as technology allows for the production of smaller and smaller device features.

As such, it can be seen that a semiconductor device including a patterned gate electrode film having isolated and nested features formed simultaneously and having the same etch bias, is desirable in the art.

SUMMARY OF THE INVENTION

To achieve these and other objects, and in view of its purposes, the present invention addresses the shortcomings of conventional attempts to produce nested and isolated features having the same dimensions within a hardmask film, and then within a gate electrode film. The present invention provides a patterned hardmask film having substantially the same etch bias for isolated and nested features. Stated alternatively, the present invention provides a patterned hardmask film having features which are formed independent of localized etching effects.

The present invention also provides a structure which includes a patterned gate electrode film having isolated and nested features having dimensions which are largely independent of the surrounding features simultaneously formed within the film. The patterned gate electrode film is formed using the patterned hardmask film. The features of the patterned gate electrode film form gate electrodes for transistors formed within the semiconductor substrate, and also serve as interconnection, and other, features. The gate electrode film may be a semiconductor, metal, or other film.

BRIEF DESCRIPTION OF THE DRAWING

FIG. 2 is a cross-sectional view showing a pattern formed within a masking film over the hardmask/gate electrode structure shown in FIG. 1;

FIG. 3 is a cross-sectional view showing a pattern formed within the hardmask film;

FIG. 4 is a cross-sectional view showing the pattern in the hardmask film after the masking film has been removed;

FIG. 5 is a cross-sectional view showing a pattern formed within the gate electrode film.

DETAILED DESCRIPTION OF THE INVENTION

Figure 1:
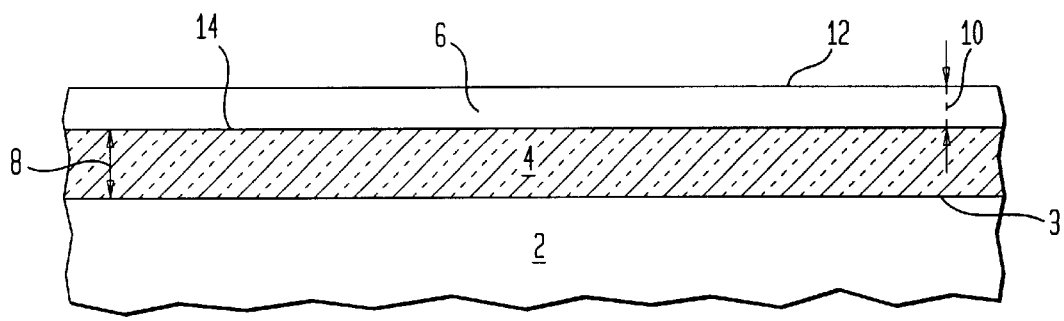
FIG. 1 is a cross-sectional view showing a hardmask film formed over a gate electrode film.

The invention is best understood from the following detailed description when read in conjunction with the accompanying drawing. It is emphasized that, according to common practice, the various features of the drawing are not to scale. On the contrary, the dimensions of the various features and the relative dimensions and locations of the features are arbitrarily expanded or reduced for clarity.

FIG. 1 is a cross-sectional view showing an exemplary embodiment of a hardmask film formed over a gate electrode film on a semiconductor substrate. In the exemplary embodiment shown, gate electrode film 4 is formed directly over top surface 3 of substrate 2 but it should be understood that a gate dielectric, or other film (not shown) may be formed between semiconductor substrate 2 and gate electrode film 4. In the preferred embodiment, semiconductor substrate 2 may be a silicon wafer commonly used in the semiconductor device manufacturing industry, but other suitable substrates may be used alternatively. In the exemplary embodiment, gate electrode film 4 may be a semiconductor film such as polysilicon, but other films may be used. For example, in another exemplary embodiment, the gate electrode film may be a metal film. Gate electrode film 4 may be formed using conventional processing techniques such as chemical vapor deposition (CVD) or sputtering, but other suitable methods may be used alternatively. In an exemplary embodiment, the thickness 8 of gate electrode film 4 may range from 1500 to 2500 angstroms, but other suitable thicknesses may be used alternatively.

Over top surface 14 of gate electrode film 4, hardmask film 6 is formed. In various exemplary embodiments, hardmask film 6 may include dielectric films such as nitrides, oxides and oxynitrides formed using CVD or plasma-enhanced CVD (PECVD) processing techniques. In the exemplary embodiment shown in FIG. 1, hardmask film 6 is formed of a single layer of material. In the exemplary embodiment, thickness 10 of hardmask film 6 may be on the order of 1200 to 1600 angstroms, most preferably about 1400 angstroms, but other suitable thicknesses may be used alternatively. Hardmask film 6 includes top surface 12. In another exemplary embodiment, an anti-reflective coating (not shown) may be formed over the hardmask film 6 to aid in the patterning process.

Figure 1A:
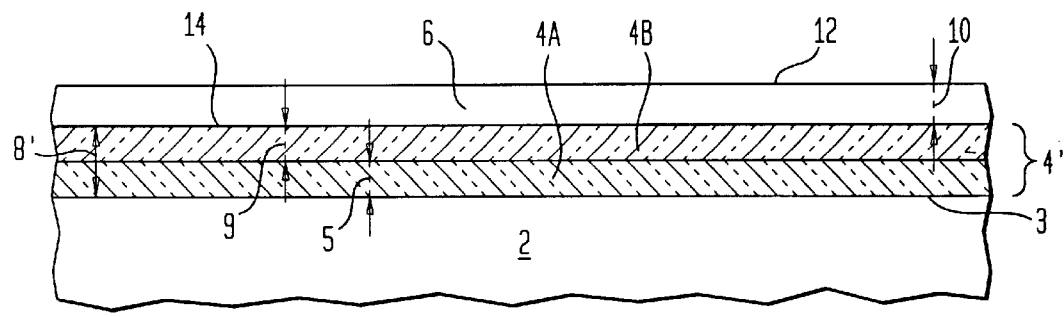
FIG. 1A is a cross-sectional view showing a hardmask film formed over a composite gate electrode film formed according to another exemplary embodiment.

FIG. 1A is a cross-sectional view showing another exemplary embodiment of the gate electrode film structure which may be used according to the present invention. In FIG. 1A, the gate electrode film 4' is a composite film formed of sub-layers 4A and 4B. In an exemplary embodiment, each of sub-layers 4A and 4B may be a semiconductor film. In another exemplary embodiment, lower sub-layer 4A may be a polysilicon film and upper sub-layer 4B may be formed of a film which is more conductive than polysilicon. Total film thickness 8' may generally be on the order of 1500 angstroms to 2500 angstroms, but may vary in alternative embodiments. In one exemplary embodiment, sub-layer 4B having thickness 9 may be a tungsten silicide film formed over sub-layer 4A which may be Ail a polysilicon film. In an exemplary embodiment, thickness 5 of polysilicon sublayer 4A may be within the range of 800 to 1200 angstroms, and thickness 9 of tungsten silicide sub-layer 4B may be on the order of 600 to 1000 angstroms, but other thicknesses may be used alternatively. In other exemplary embodiments, semiconductor films other than polysilicon may be used as lower sub-layer 4A, and upper sub-layer 4B may be formed of other silicide films such as TaSi, TiSi or CoSi.

Figure 2:
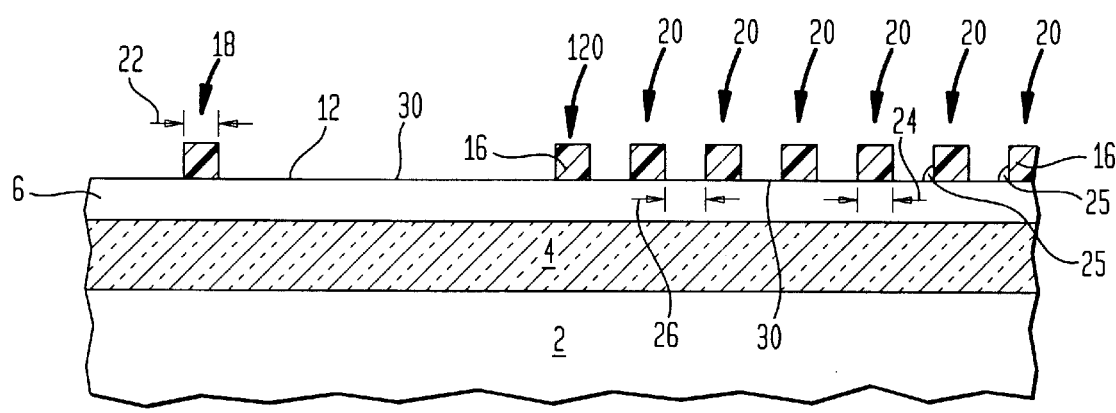
FIGS. 2–5 are cross-sectional views showing the process sequence used to form the patterned gate electrode film according to an exemplary embodiment of the present invention.

Although the initial patterning steps, as shown in FIG. 2, may be applied equally to the composite film structure shown in FIG. 1A, for purposes of brevity, the steps in the processing sequence shown in FIGS. 2–5 will be shown in conjunction with the structure having a single semiconductor film forming the gate electrode layer, as shown in FIG. 1.

FIG. 2 shows a patterned masking film 16 formed over top surface 12 of hardmask film 6 of the structure shown in FIG. 1. In the preferred embodiment, masking film 16 may be a photosensitive film such as photoresist, commonly used in the semiconductor device manufacturing industry. Conventional methods for coating, exposing, and developing the film may be used to pattern masking film 16. The cross section of the pattern formed within masking film 16 and shown in FIG. 2, includes isolated feature 18 and a plurality of nested features 20. It can be seen that nested features 20 are tightly packed, with respect to one another. Feature 120 is distinguished from both the isolated feature 18 and the nested features 20 because it is the outermost feature of a plurality of adjacent features, and includes one side isolated from the effects of adjacent features and the other side in relative close proximity to other features. Exposed sections 30 of top surface 12 of hardmask film 6 are sections not covered by masking film 16.

Isolated feature 18 includes width 22. In the exemplary embodiment, the width may be on the order of 0.25 microns or less, but it should be understood that the process of the present invention applies equally to features of any lateral dimension. Features 20 each include a width 24. In the exemplary embodiment, the width 24 corresponding to each feature 20 may be identical. In the exemplary embodiment, width 24 may be on the order of 0.25 microns or less, but as with the width of isolated feature 18, width 24 may be of any dimension. For purposes of simplicity, width 24 of nested feature 20, and width 22 of isolated feature 18, will be shown and described as being of the same dimension. In this manner it can be shown that the final features formed by eventually etching gate electrode film 4, will have the same width for both nested and isolated features, since the nested 20 and isolated 18 features of the pattern formed within masking film 16 each have the same width and the hardmask etching process of the present invention etches features 18 and 20 with essentially the same etch bias. Adjacent nested features 20 are spaced apart by a distance 26. For purposes of simplicity, and in the exemplary embodiment, the spacing 26 between each adjacent nested feature may be of the same dimension.

Figure 3:
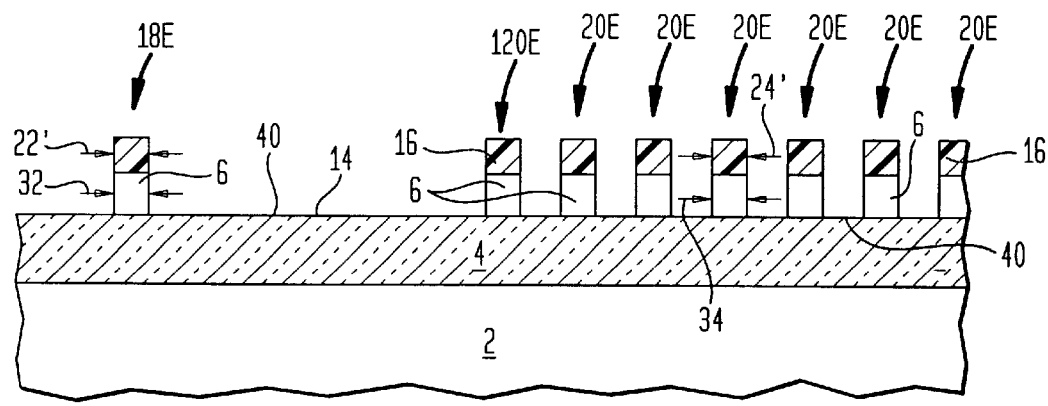

Now turning to FIG. 3, the hardmask film 6 is shown as being etched by the process according to the present invention. It can be seen that the sections of the hardmask film 6 which were not covered by masking film 16 (exposed sections 30 as shown in FIG. 2) are completely removed by etching. The etch process used to remove exposed sections of hardmask film 6, is a two-step operation. The first step includes a reactive ion etch (RIE) etching step including argon as an etchant gas. In an exemplary embodiment, 25 sccm of argon may be used during this etching step. In another exemplary embodiment, the etch gas mixture may additionally include oxygen, within the range of 2 to 5 sccm. It should be understood, however, that the absolute and relative flow rates of argon and oxygen may be varied in alternative embodiments. The etching process takes place at a pressure ranging from 10 to 20 millitorr, 15 millitorr in the preferred embodiment. Also in the preferred embodiment, the power used in this first step of the etch process may range from 400 watts to 500 watts, but in alternative embodiments other power levels may be used. In the exemplary embodiment, the etching time may range from seven to ten seconds. This first etching step is directed to selectively removing any photoresist footing which may form at the base of the photoresist pattern. Photoresist footing 25 is shown in FIG. 2 to exist at the base (foot) of only two of the features 20 formed of the masking film 16. This is intended to be exemplary, and photoresist footing 25 may be formed at the base of any and all features formed within patterned masking film 16 due to limitations in the processes for patterning the masking film.

After the highly-selective, highly-directional argon chemistry step is used to remove any possible photoresist footing, the main etch step for etching the bulk of the hardmask film 6 follows. The main etch step is an RIE operation using a $C_2F_6$ chemistry. The $C_2F_6$ chemistry differs from processes using mixtures of $CHF_3$ and $CF_4$. The main etch step is a low pressure etch which also includes oxygen. In the preferred embodiment, the main etch step may be carried out at a pressure within the range of 15 to 25 millitorr, but other pressure values may be used alternatively. In the preferred embodiment, the main etch step uses a relatively high power ranging from 600 to 800 watts when etching a 200 mm diameter wafer, and is performed within a magnetic field of 10 to 30 Gauss, but alternative power and magnetic field values may be used. Furthermore, when larger or smaller wafers are being etched, the power may be scaled up or down, respectively, to provide a similar power density (1.91 watts/cm$^2$ to 2.55 watts/cm$^2$) upon the wafer surface. Also in the preferred embodiment, the gas mixture may include 20 to 30 sccm of $C_2F_6$ and 4 to 10 sccm of $O_2$ but other flow ratios and flow rates may be used in alternative embodiments. The high bias used in the etch process produces an extremely directional, anisotropic etch process which helps to maintain the line width and other dimensions of the features being transferred from the patterned masking film to hardmask film.

The main etch step is used to etch away the entire thickness of hardmask film 6, in exposed sections 30 not covered by masking film 16. This exposes corresponding uncovered sections 40 of top surface 14 of gate electrode film 4.

It should be understood that, although the main etch steps of the present invention are as described above, the process of the present invention may be incorporated within a longer etch process sequence which includes additional etch steps. For example, if an anti-reflective coating is used over the dielectric hardmask film, an etch process directed to removing the anti-reflective coating may be included prior to the argon chemistry step. Similarly, a conventional, selective overetch step may be added to insure complete removal of the hardmask film.

Referring now to etched isolated feature 18E as shown in FIG. 3, it can be seen that width 32 of hardmask 6 section of etched isolated feature 18E is the same as width 22' of masking film 16 section of etched isolated feature 18E. The difference between width 22 of the unetched photoresist of isolated feature 18 as shown in FIG. 2, and etched width 22' (and width 32) of the etched photoresist film as shown in FIG. 3, is commonly referred to as the etch bias. Using conventional processing methods, the etch bias for a nested feature differs from the etch bias for an isolated feature. This is due to the deposition of polymeric bi-products produced during the etching process. The polymeric bi-products passivate exposed surfaces of the features being produced by etching, and cause the isolated features (such as feature 18E) to develop relatively larger dimensions (widths) during the etch process than tightly packed features (such as feature 20E). This effect is more pronounced for isolated features than it is for nested features because polymer buildup is minimized due to the proximity of adjacent features. As a result, when a pattern is created within a masking film which includes isolated and nested features having the same width, the etched isolated feature formed from this masking pattern will generally have a wider width than the etched nested feature. Because of the difference in etch bias for an isolated feature and a nested feature using conventional processes, the isolated feature will generally be wider by approximately 50 nm.

According to the process of the present invention, the difference between width 34 of the hardmask 6 section of nested etched feature 20E, and width 32 of the hardmask section of isolated etched feature 18E, may be 15 nm or less. In an exemplary embodiment in which width 22 of unetched isolated feature 18 is 0.25 microns and in which width 24 of unetched nested feature 20 is 0.25 microns, a difference of 15 nm or less represents an etch bias difference between nested and isolated features of 6% or less. According to other exemplary embodiments, the difference in etch bias may vary and remain less than a 13% difference. In an exemplary embodiment width 34 and width 32 may be substantially the same. This is due to the etching chemistry, the process conditions, and the addition of $O_2$ which provides substantially the same etch bias for both isolated and nested features by preventing the deposition of polymeric bi-products on the features being etched.

Figure 4:
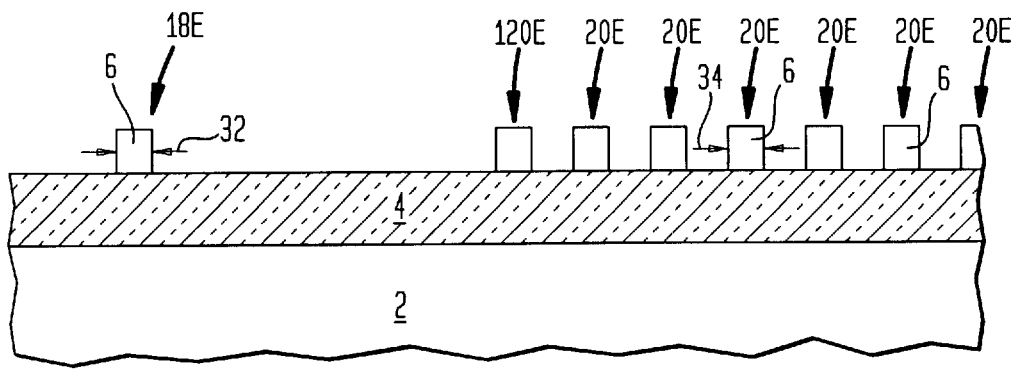
Figure 5:
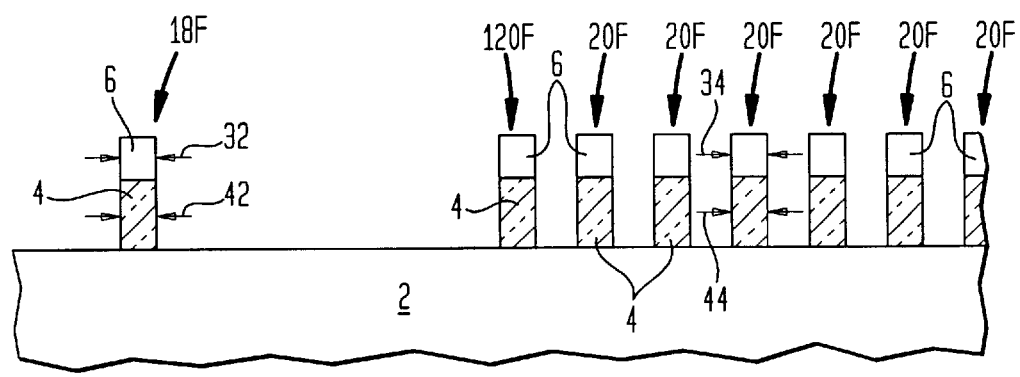
Figure 5A:
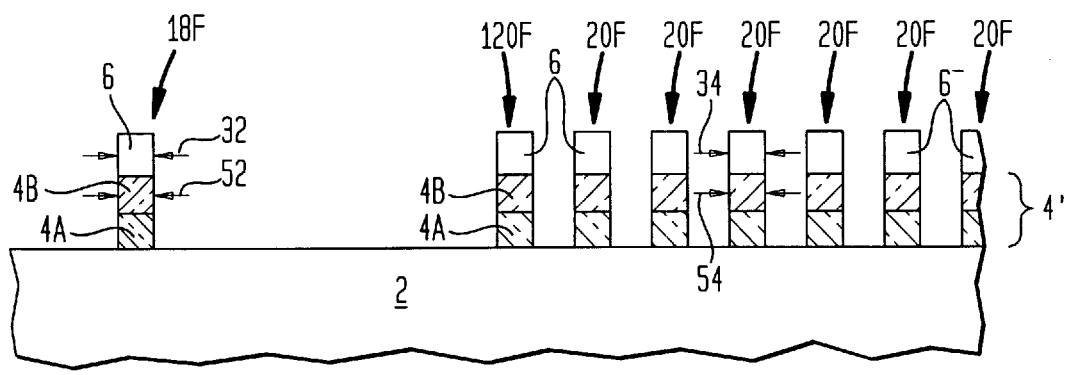
FIG. 5A is a cross-sectional view of an alternative embodiment showing a pattern formed within the composite gate electrode film shown in FIG. 1A.

FIG. 4 shows the pattern in the hardmask film after the photoresist masking film has been removed. Any suitable method for selectively removing a masking film may be used. Many such methods are available in the art. In alternative embodiments, the photoresist masking film (16 as in FIG. 3) may not be removed until after the formation of the pattern within the gate electrode film 4 or 4A, as shown in FIGS. 5 and 5A, respectively. For matters of simplicity, the etched patterns shown in FIGS. 5 and 5A are shown without masking film 16 according to the preferred embodiment whereby masking film 16 is removed prior to etching the gate electrode film 4 or 4A.

According to the next processing operation shown in FIG. 5, exposed sections 40 of gate electrode film 4, are then removed by etching. In an exemplary embodiment, this etch process may be performed in-situ with the preceding etch operation for etching the hardmask film. In another exemplary embodiment, the two etch operations may comprise different etch operations. In yet another embodiment (as described in conjunction with FIG. 4), the etch operation used to remove portions of gate electrode film 4 may be performed prior to the removal of the photoresist masking film 16.

In the exemplary embodiment in which an individual gate electrode film 4 comprises a polysilicon film, a high density plasma, RIE etch process commonly used to etch polysilicon in the semiconductor processing industry, may be used to produce the structure shown in FIG. 5. A selective process which etches the polysilicon film 4, but does not significantly attack the hardmask 6 sections of features 18E, 20E and 120E, may be used. Common examples of etch gasses used to etch polysilicon include HBr and chlorine chemistries, with $O_2$ and He added to improve the selectively to the dielectric hardmask film.

Once the dimensions of the features of the patterned hardmask film are fixed, as described in conjunction with FIG. 3, it has been found that these dimensions (width 32 for etched isolated feature 18E, and width 34 for etched nested feature 20E for example) are generally transferred to the etched polysilicon features shown in FIG. 5. This is due to the [polysilicon: hardmask] selectivity available in processes for etching the polysilicon film. For other exemplary embodiments wherein gate electrode film 4 is a film other than polysilicon, a suitable etch process with favorable [gate electrode film: hardmask] selectivity may be used to etch the gate electrode film.

As shown in FIG. 5, width 32 previously produced in the hardmask pattern during the hardmask etch, is generally unchanged during the etching of the gate electrode film, and width 42 of the etched gate electrode film is generally identical to width 32 in finally etched isolated feature 18F. Similarly, width 34 of the hardmask film 6 is generally unchanged during the gate electrode etching process, and is substantially equal to width 44 of the etched gate electrode feature formed beneath it in finally etched nested feature 20F. It can be then understood that the etch bias during the process for etching the hardmask film, and the difference in the etch bias between nested features and isolated features which are produced during the hardmask etching process, are determinative of the widths and the relative widths 42, 44 of finally etched isolated feature 18F, and finally etched nested feature 20F formed within the gate electrode 4 film.

It is important to produce features within the gate electrode film having the same dimension, because these features may be used as interconnection lines, or as the gate electrode for a transistor device to be formed within semiconductor substrate 2. In that case, width 42 or 44 may represent the gate length of a transistor formed having source and drain regions (not shown) formed within the substrate and laterally adjacent to the base of the gate electrode structure e.g. feature 18F or 20F.

Now turning to FIG. 5A, an alternative embodiment of an etched gate electrode film is shown. In FIG. 5A, gate electrode film 4' is a composite film comprised of two distinct sub-layers 4A and 4B. As described in conjunction with FIG. 1A, in an exemplary embodiment, film 4B may be a tungsten silicide film formed over a film 4A which is a polysilicon film. Any suitable etch process available in the art, which effectively transfers the pattern formed in a hardmask film to the composite gate electrode film 4', can be used. In an exemplary embodiment, the process for etching a polysilicon film is as described in conjunction with FIG. 5, and the process used for etching a tungsten silicide film is an RIE process which may be chorine-rich, or may include chlorine, $CF_4$, and $SF_6$ as etch gasses. When films other than tungsten silicide are used as the upper sublayer film 4B, other suitable etching processes may be used to etch the films. Process details of the etch process are determined by specific applications and many suitable processes are available in the art.

Similar to the embodiment shown as in FIG. 5, in FIG. 5A, width 52 of finally etched isolated feature 18F formed within the patterned composite gate electrode film is essentially equal to line width 32 of the hardmask film which is essentially unchanged during the gate electrode film etching process which selectively removes portions of the gate electrode film 4' which are not covered by patterned sections of hardmask film 6. Similarly, width 54 of finally etched nested feature 20F, is essentially equal to width 34 of the hardmask film 6 section of nested feature 20. As above, width 34 of hardmask film 6 of nested feature 20F is relatively unchanged during the etch process chosen to etch the gate electrode film 4'. This is due to the [gate electrode film: hardmask] selectively available in processes for etching the composite gate electrode film 4'.

Furthermore, width 52 of finally etched isolated feature 18F will be substantially similar to width 54 of finally etched nested features 20F for the same reasons discussed in conjunction with FIGS. 2–5. Namely, the etch bias during the process for forming a pattern in hardmask film 6 from photoresist masking film (as shown and discussed in conjunction with FIGS. 2 and 3) is essentially the same for nested and isolated features due to the process conditions of the present invention, and the widths 22 and 24 of isolated and nested features, respectively, formed within masking film 16 (as shown in FIG. 2) were the same.

Although described in conjunction with the gate electrode film consisting of a single polysilicon layer, or a composite film including polysilicon and a silicide film, it should be understood that the process and structure of the present invention are directed to a much broader application than described in conjunction with the exemplary embodiments. The process of the present invention may be used for forming a pattern within any semiconductor or other film used in conjunction with a hardmask. For example, a structure including a hardmask film formed over a metal film such as used as an interconnect, may be patterned and etched according to the process of the present invention. As described above, the advantage offered by the present invention is the similarity of etch bias for both isolated and nested features which produces nested and isolated features in the patterned hardmask film having the same dimensions when formed from a masking film having nested and isolated features of the same dimension. Once the hardmask pattern has been formed, it can be seen that conventional processing available today, can effectively transfer the pattern from the hardmask film to the underlying film which may be a gate electrode or metal film, without introducing differences between nested and isolated structures.

The preceding merely illustrates the principals of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principals, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A semiconductor device comprising a pattern formed within a composite film including a masking film formed on a single hardmask film formed on a lower film, said pattern including a plurality of isolated features and a plurality of nested features wherein a first average etch bias of said plurality of isolated features and a second average etch bias of said plurality of nested features differ by less than 13%, and said lower film is an interconnect film.

2. The semiconductor device as in claim 1, wherein said plurality of isolated features includes an average isolated masking width, an average isolated hardmask width and an average isolated lower film width, said plurality of nested features includes an average nested masking width, an average nested hardmask width and an average nested lower film width, and said first average etch bias comprises a difference between said average isolated masking width and said isolated lower film width, and said second average etch bias comprises a difference between said average nested masking width and said average nested lower film width.

3. The semiconductor device as in claim 2, wherein said lower film comprises a semiconductor film.

4. The semiconductor device as in claim 2, wherein said lower film comprises polysilicon.

5. The semiconductor device as in claim 2, wherein said lower film comprises a metal film.

6. The semiconductor device as in claim 2, wherein said lower film comprises a composite film including a tungsten silicide film and a polysilicon film.

7. The semiconductor device as in claim 2, wherein said masking film comprises photoresist.

8. The semiconductor device as in claim 2, wherein said hardmask film comprises one of an oxide film, a nitride film, and an oxynitride film.

9. The semiconductor device as in claim 2, wherein said plurality of isolated features and said plurality of nested features each include gate electrodes for transistors formed in a semiconductor substrate.

10. The semiconductor device as in claim 2, wherein said features of said plurality of isolated features and said plurality of nested features comprise lines.

11. A semiconductor device comprising a pattern formed within a stack of films including a masking film formed on a single hardmask film formed on a lower film, said pattern including a plurality of isolated features and a plurality of nested features wherein a first average etch bias of said plurality of isolated features and a second average etch bias of said plurality of nested features differ by less than 13%, and said lower film is an interconnect film.

12. A patterned interconnect film formed over a semiconductor substrate and having a plurality of raised features simultaneously formed therewithin, said plurality of raised features including nested features and isolated features, each raised feature of said plurality of raised features having a lateral dimension independent of all other said features.

13. The patterned film as in claim 12, wherein said patterned interconnect film comprises a semiconductor film.

14. The patterned film as in claim 13, wherein said semiconductor film comprises polysilicon.

15. The patterned film as in claim 12, wherein said patterned film comprises a metal film.

16. The patterned film as in claim 13, wherein said semiconductor film comprises a composite film structure including a lower polysilicon film and an upper film having a greater conductivity than said polysilicon film.

17. The patterned film as in claim 12, wherein said plurality of features are simultaneously formed by etching.

18. An integrated circuit device including the semiconductor device as in claim 1.

* * * * *